United States Patent
Egerer et al.

(10) Patent No.: US 7,272,063 B1
(45) Date of Patent: Sep. 18, 2007

(54) MEMORY WITH A TEMPERATURE SENSOR, DYNAMIC MEMORY AND MEMORY WITH A CLOCK UNIT AND METHOD OF SENSING A TEMPERATURE OF A MEMORY

(75) Inventors: Jens Christoph Egerer, Kirchheim (DE); Georg Braun, Holzkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/386,048

(22) Filed: Mar. 21, 2006

(51) Int. Cl.
*G11C 7/04* (2006.01)
(52) U.S. Cl. .................. 365/212; 365/211
(58) Field of Classification Search ............ 365/212
See application file for complete search history.

(56) References Cited

U.S. PATENT DOCUMENTS

| | | | |
|---|---|---|---|
| 5,784,328 A * | 7/1998 | Irrinki et al. | 365/222 |
| 5,956,289 A * | 9/1999 | Norman et al. | 365/233 |
| 6,661,724 B1 * | 12/2003 | Snyder et al. | 365/211 |
| 6,768,693 B2 * | 7/2004 | Feurle et al. | 365/222 |
| 6,775,196 B2 * | 8/2004 | Perner et al. | 365/211 |
| 2003/0156483 A1 | 8/2003 | Feurle et al. | |
| 2005/0141311 A1 * | 6/2005 | Kim et al. | 365/222 |
| 2006/0159156 A1 * | 7/2006 | Lee et al. | 374/183 |
| 2007/0019488 A1 * | 1/2007 | Heilmann et al. | 365/211 |

* cited by examiner

*Primary Examiner*—Son L. Mai
(74) *Attorney, Agent, or Firm*—Patterson & Sheridan, L.L.P.

(57) ABSTRACT

Methods and apparatus for determining a temperature of a memory device. A memory device includes a memory array, a temperature configured to measure a temperature of the device and an evaluating circuit configured to receive a signal representative of the temperature measured by the temperature sensor and configured to generate a code word indicative of the measured temperature and a type of the temperature sensor, the temperature sensor being selected from one of at least two different temperature sensor types.

22 Claims, 4 Drawing Sheets

FIG 4

| Output Code | Range (2 MSBs) | Difference in deg C (6 LSBs) | Trip point sensor | Continuous sensor | Temperature range name |
|---|---|---|---|---|---|
| 00000000 | 00 | 000000 | Incomplete conversion (in progress...) | | IC |
| 00111111 | 00 | 111111 | Tj < Tjx | Tj = Tjx - 63 | |
| 00111110 | 00 | 111110 | — | Tj = Tjx - 62 | |
| ... | ... | ... | ... | ... | |
| 00000011 | 00 | 000011 | — | Tj = Tjx - 3 | |
| 00000010 | 00 | 000010 | — | Tj = Tjx - 2 | |
| 00000001 | 00 | ~~000001~~ | — | Tj = Tjx - 1 | |
| ~~00000000~~ | ~~00~~ | ~~000000~~ | — | ~~Tj = Tjx - 0~~ | |
| 01111111 | 01 | 111111 | Tj < Tj7.8 | Tj = Tj7.8 - 63 | |
| 01111110 | 01 | 111110 | — | Tj = Tj7.8 - 62 | |
| ... | ... | ... | ... | ... | TR7.8 |
| 01000011 | 01 | 000011 | — | Tj = Tj7.8 - 3 | |
| 01000010 | 01 | 000010 | — | Tj = Tj7.8 - 2 | |
| 01000001 | 01 | 000001 | — | Tj = Tj7.8 - 1 | |
| ~~01000000~~ | ~~01~~ | ~~000000~~ | — | ~~Tj = Tj7.8 - 0~~ | |
| 10111111 | 10 | 111111 | Tj < Tjom | Tj = Tjom - 63 | |
| 10111110 | 10 | 111110 | — | Tj = Tjom - 62 | |
| ... | ... | ... | ... | ... | TR3.8 |
| 10000011 | 10 | 000011 | — | Tj = Tjom - 3 | |
| 10000010 | 10 | 000010 | — | Tj = Tjom - 2 | |
| 10000001 | 10 | 000001 | — | Tj = Tjom - 1 | |
| ~~10000000~~ | ~~10~~ | ~~000000~~ | — | ~~Tj = Tjom - 0~~ | |
| 11111111 | 11 | 111111 | Tj >= Tjom | Tj = Tjom + 63 | |
| 11111110 | 11 | 111110 | — | Tj = Tjom + 62 | |
| ... | ... | ... | ... | ... | |
| 11000011 | 11 | 000011 | — | Tj = Tjom + 3 | TR_OH |
| 11000010 | 11 | 000010 | — | Tj = Tjom + 2 | |
| 11000001 | 11 | 000001 | — | Tj = Tjom + 1 | |
| 11000000 | 11 | 000000 | — | Tj = Tjom + 0 | |
| 41 | 42 | 43 | 44 | 45 | 46 |

25

MEMORY WITH A TEMPERATURE SENSOR, DYNAMIC MEMORY AND MEMORY WITH A CLOCK UNIT AND METHOD OF SENSING A TEMPERATURE OF A MEMORY

BACKGROUND OF THE INVENTION

1. Field of the Invention

The invention refers to a memory with a temperature sensor, a dynamic memory with a temperature sensor with a controlling circuit for refreshing the charge of memory cells of the dynamic memory, a memory with a temperature sensor with a clock unit that delivers a clock signal for controlling reading or writing data from or in the memory cells and a method of sensing a temperature of a memory.

2. Description of the Related Art

An integrated dynamic memory is known that contains a control circuit for controlling a refresh mode in which the charges of the memory cells are refreshed. A controllable frequency generator serves for setting a refresh frequency. A temperature sensor circuit detects a temperature of the memory and outputs a first reference value, and an externally writable circuit is provided for outputting a second reference value. The temperature sensor circuit and the externally writable circuit are alternatively connectable to the control input of the frequency generator for setting the refresh frequency. If the externally writable circuit has been written, the second reference value, which corresponds to a temperature, is fed to the frequency generator; otherwise, the first reference value is supplied. In this manner, users of the memory that are unable to measure temperature can expediently optimize the power consumption that is necessary for stand-by mode and reduce it at low temperatures.

There are different types of temperature sensors. In one example a simple temperature sensor detects whether the temperature is higher or lower as a reference temperature. A further type of temperature sensor senses a temperature difference compared to a reference value. Depending on the type of temperature sensor different codes representing the information of the temperature sensor are used.

SUMMARY OF THE INVENTION

Embodiments of the invention include a memory with a temperature sensor that measures the temperature of a part of the memory, and with a code circuit, that is connected with the temperature sensor, whereby the code circuit transfers the signal of the temperature sensor to a code word, the code word comprising a first part and a second part. The first part comprises at least one bit for a first type of temperature sensor and the second part comprises at least one bit for a second type of temperature sensor, the code circuit writes depending on the type of temperature sensor and the signal of the temperature sensor a predetermined code in the first part and/or the second part, the code circuit provides the code word.

In a further embodiment the invention refers to a memory with a temperature sensor that measures the temperature of a part of the memory, with a code circuit, that is connected with the temperature sensor, whereby the code circuit transfers the signal of the temperature sensor to a code word, the code word comprises a first part and a second part, whereby the first part comprises at least one bit to indicate a temperature range limited by a reference temperature and the second part comprises at least one bit to indicate a temperature difference to the reference temperature, the code circuit writes depending on the signal of the temperature sensor a predetermined code in the first part and a further predetermined code in the second part depending on the signal and/or the type of temperature sensor, the code circuit provides the code word.

Furthermore the invention refers to a dynamic memory with a temperature sensor that measures the temperature of a part of the memory, with a code circuit, that is connected with the temperature sensor, whereby the code circuit transfers the signal of the temperature sensor to a code word, the code word comprises a first part and a second part, whereby the first part comprises at least one bit for a temperature range compared to a reference temperature and the second part comprises at least one bit for a difference temperature to the reference temperature, the code circuit writes depending on the signal of the temperature sensor a code in the first part and a further code in the second part of the code word depending on the type of the temperature sensor and the signal of the temperature sensor, the code circuit delivers the code word to a controlling circuit, the controlling circuit controls a refresh operation for refreshing charges that are stored in memory cells of the memory depending on the code word.

In another embodiment the invention refers to a memory with a temperature sensor that measures the temperature of a part of the memory, with a code circuit, that is connected with the temperature sensor, whereby the code circuit transfers the signal of the temperature sensor to a code word, the code word comprises a first part and a second part, whereby the first part comprises at least one bit for a temperature range compared to a reference temperature and the second part comprises at least one bit for a difference temperature referred to the reference temperature, the code circuit writes depending on the signal of temperature sensor a predetermined code in the first part and a further code depending on the signal of the temperature sensor and the type of the temperature sensor in the second part of the code word, the code circuit delivers the code word to a controlling circuit, the controlling circuit controls a frequency of read or write operations of the memory depending on the code word.

Furthermore the invention refers to a memory with a temperature sensor that measures the temperature of a part of the memory, with a code evaluating means, that is connected with the temperature sensor, whereby the code evaluating means transfers the signal of the temperature sensor to a code word, the code word comprises a first part and a second part, whereby the first part comprises at least one bit for a first type of temperature sensor and the second part comprises at least one bit for a second type of temperature sensor, the code evaluating means write depending on the type of temperature sensor and the signal of the temperature sensor a predetermined code in the first and/or the second part of the code word, the code evaluating means providing the code word.

Furthermore the invention refers to a method of sensing a temperature of a memory with memory cells, with a temperature sensor, that delivers a temperature signal that is transferred in a code word, whereby the code word comprises a first part and a second part, whereby the first part is disposed for a first temperature sensor and the second part is disposed for a second temperature sensor, whereby depending on the type of temperature sensor and the signal of the temperature sensor a code is written in the first and/or the second part of the code word.

In another embodiment the invention refers to a method of sensing a temperature of a memory with memory cells, with a temperature sensor, that delivers a temperature signal that is transferred in a code word, whereby the code word comprises a first part and a second part, whereby the first part is disposed for a temperature range compared to a reference temperature and the second part is disposed for a temperature difference with regard to the reference temperature, whereby depending on the signal of the temperature sensor data is written in the first part and depending on the signal and the type of the temperature sensor data is written in the second part of the code word.

In another embodiment the invention refers to a memory with an evaluating circuit that receives a signal of a temperature sensor, whereby the evaluating circuit determines a first part of a code word as a temperature range limited by a reference temperature depending on the signal and a second part of a code word as a temperature difference to the reference temperature that limits the temperature range.

The construction and method of operation of the invention, however, together with additional objects and advantages thereof will be best understood from the following description of specific embodiments when read in connection with the accompanying drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4 is a code table; and

DETAILED DESCRIPTION OF THE PREFERRED EMBODIMENT

Figure 1:
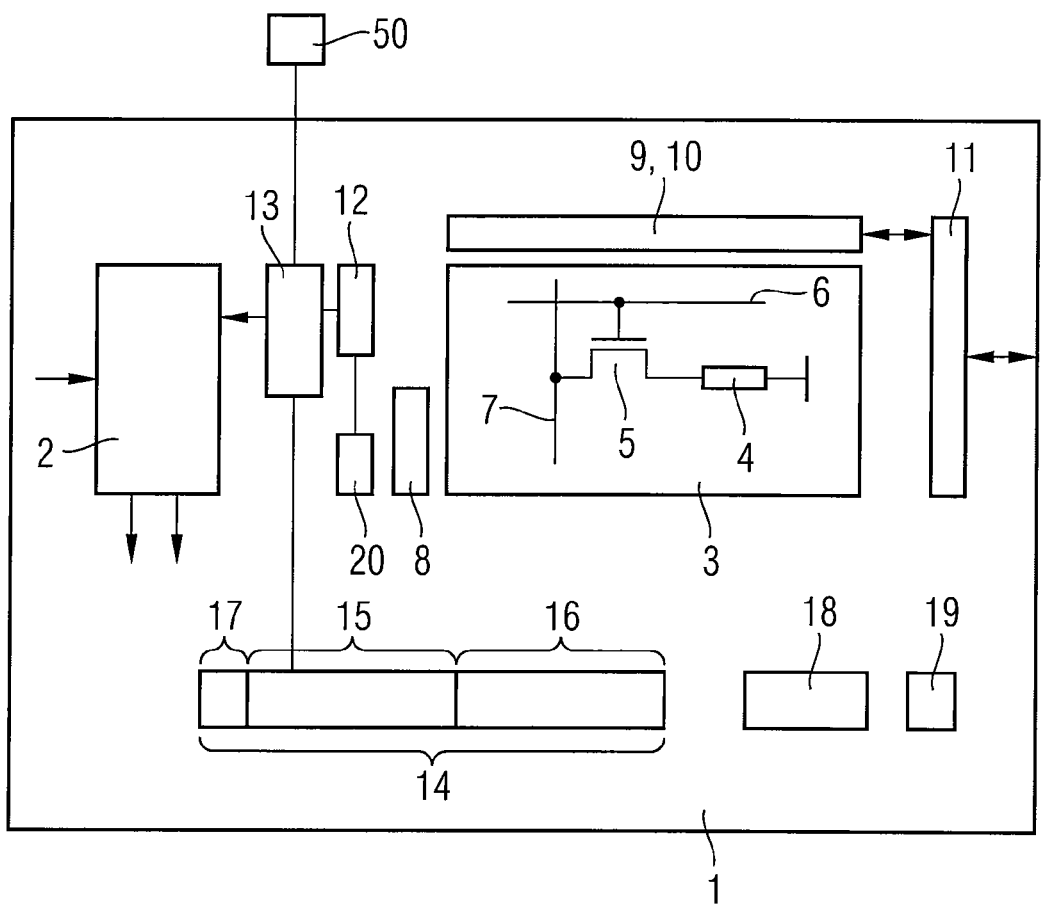
FIG. 1 is a block diagram of an embodiment of a dynamic memory.

Referring now to the Figures of the drawing in detail on first, particularly, FIG. 1 depicts a memory 1 that may be a random access memory. In further embodiments the memory may be a dynamic memory (DRAM), a static memory (SRAM) or a non-volatile memory. The depicted memory 1 comprises a control unit 2, a cell array 3 with memory cells 4, with bit lines 7 and word lines 6, whereby the memory cells 4 are connectable by selecting switches 5 with respective bit lines 7. Depending on the embodiment the memory cells are static memory cells that do not loose the information or dynamic memory cells that have to be refreshed for storing the information. The selecting switches 5 are controlled by a word line 6. A word line decoder 8 and a bit line decoder 9 are disposed that select depending on a word line address and a bit line address a respective word line and a respective bit line and connect the bit line with a predetermined memory cell. The word line decoder 8 and the bit line decoder 9 are controlled by the control unit 2. The control unit 2 receives control commands that determine the function of the control unit 2.

Furthermore, sense amplifiers 10 are disposed in the memory 1 that are connected with the bit lines 7 for amplifying a voltage on the bit line that is generated by reading out the data that is stored in a memory cell 4. The data of the bit lines are outputted by input/output units 11. Additionally, the input/output units 11 are used for writing data in the memory cells 4. In the depicted embodiment, the selecting switch 5 is constructed as a selection transistor that connects the respective memory cell 4 with the respective bit line 7 if an activating voltage is applied by the word line decoder 8 to the word line 6 that is connected with a gate of the selecting transistor. The bit line decoder 9 selects the respective bit line 7 and connects it with a sense amplifier 10. In the cell array 3 multiple word lines 6 and multiple bit lines 7 are disposed, whereby in the exemplary drawing only one bit line 7 and one word line 6 are represented. Also multiple memory cells 4 are disposed in the cell array 3 that are connectable to respective bit lines by selecting switches 5 that are controlled by respective word lines. Therefore each of the memory cells 4 may be selected individually and data may be read from or written to the memory cells 4 over the input/output units 11.

For a read or a write operation a time basis may be used that is provided by a clock circuit 19. The clock circuit 19 delivers an alternating clock signal to other circuits i.e. to the word line decoder 8 or the bit line decoder 9 or the sense amplifier 10 or the output/input unit 11. A rising or falling edge of the clock signal is used as a time point for starting writing or reading data of the memory cells 4. Additionally the time basis may also be used for other operations of the memory 1. The clock circuit 19 may comprise an oscillator that delivers an alternating clock signal with a constant frequency that is fed to a programmable frequency divider, by which the frequency can be divided. The clock circuit 19 is connected by a controlling line with the control unit 2. Depending on the input signal of the control unit 2 that is fed to the clock circuit 19 the clock circuit 19 changes the frequency of the clock signal.

A temperature sensor 12 is disposed on the memory 1 nearby the cell array 3 and is connected with a code circuit 13. The code circuit 13 may be connected with the control unit 2 and is connected with a code register 14. The temperature sensor 12 may be connected with a reference register 20. The temperature sensor 12 measures a temperature of the memory 1 and outputs a sensor signal to the code circuit 13. The code circuit 13 writes a code word in the code register 14 depending on the measured temperature and depending on the type of temperature sensor 12.

The temperature sensor 12 may be constructed as a single trip point sensor that detects whether the temperature of the memory is lower or higher than a reference temperature, that may be stored in the temperature register 20. In another embodiment the temperature sensor may be a multitrip point sensor, i.e. a two trip-point sensor that indicates whether a sensed temperature is within one of three temperature ranges that are defined by two reference temperatures. The two trip-point sensor detects whether the sensed temperature is lower than a first reference temperature between the first and the second temperature or higher than the second temperature.

In another embodiment, the temperature sensor 12 may be a continuous sensor that detects a temperature difference between the temperature of the memory 1 and at least one reference temperature that may be stored in the register 20.

The code circuit 13 may deliver the code word that is stored in the code register 14 to the control unit 2. The control unit 2 controls depending on the measured temperature. In one embodiment, the frequency of the access to the memory cells, i.e. writing or reading data may be reduced if the measured temperature of the memory 1 is higher than the reference temperature. The control unit 2 may increase the frequency of accessing the memory cells if the sensed temperature of the memory 1 is lower than the reference temperature. Therefore it is possible to prevent an overheating of the memory 1 and to use a suitable frequency for reading and writing data in the memory 1. The code register 14 may be read by off-chip circuit, e.g. a memory controller, to be used by said memory controller to change the frequency of memory accesses in order to change the speed and power dissipation of the memory.

In a further embodiment, if the memory 1 is a dynamic memory with memory cells 4 that have to be refreshed, a refresh circuit 18 is disposed on the memory that is controlled by the control unit 2. The refresh circuit 18 is connected with the memory cells 4 and refreshes the charge of the memory cells 4 depending on a refresh frequency that is generated by the refresh circuit 18. The refresh frequency may be generated by an oscillator with an independent oscillating time signal that is delivered to a further frequency divider by which the refresh frequency can be divided. The further frequency divider is controlled by the control unit 2. The control unit 2 controls the refresh frequency depending on the sensed temperature of the memory 1. The refresh frequency can be changed by way of modifying the divider factor of a frequency divider by the control unit 2. If the temperature of the memory 1 is lower than a second reference temperature, then the refresh frequency is set by the control unit 2 to a first value. If the temperature of the memory 1 is higher than a second reference temperature, then the control unit 2 changes the refresh frequency to a higher second value, because the memory cells 4 may loose the stored charge in a shorter time because of the higher temperature.

During a refresh operation, the data signals that are evaluated and amplified by the respective sense amplifier are written back in their relevant memory cells directionally. The refresh circuit 18 controls the refresh mode of the memory cells. In particular, in a refresh mode of the memory, the power consumption required as a result of the necessary activating of respective sense amplifiers correlates with the refresh frequency. In the interest of achieving an optimally small power consumption, it is desirable for the time period between two refresh cycles to be optimally long, in other words for their refresh frequency to be optimally low. The maximum achievable retention time of the contents of the memory cells is decisive for determining the length of time required between two refresh cycles. This is influenced particularly by leakage currents and the storage capacitor and/or the selection transistor that increases as the memory temperature rises.

In a further embodiment, the control unit 2 changes the frequency of refresh operations, i.e. at a higher temperature the refresh operations are processed with a shorter time interval between two refresh operations. In a further embodiment, the control unit 2 controls the read and write operation with a lower frequency if the memory 1 has a higher temperature.

In a further embodiment the code circuit 13 may be connected with an external control unit 50 that is not arranged on the memory 1 but connectable with the memory 1. The code circuit 13 delivers the code word to the external control unit 50. The external control unit 50 may control the refresh and/or the frequency of accesses to the memory cells according to the code words.

Figure 2:
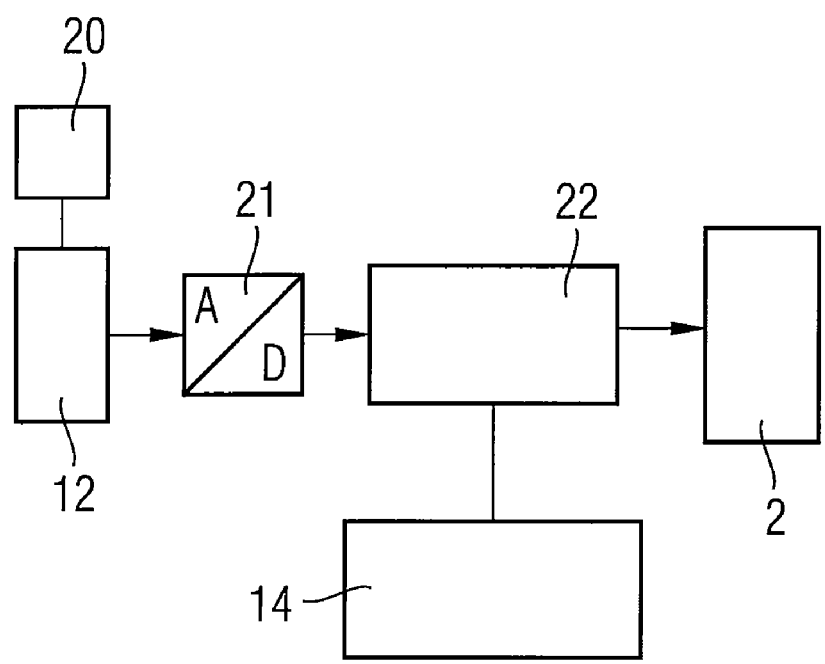
FIG. 2 is a detailed view of a code circuit.

FIG. 2 depicts a more detailed view of the code circuit 13. In one embodiment, the code circuit 13 may comprise an A/D converter 21 and an evaluating circuit 22. The A/D converter 21 receives an analog signal of the temperature sensor 12. The A/D converter 21 transfers the analog signal in a digital signal that is delivered to the evaluating circuit 22. The evaluating circuit 22 transfers the digital signal in a code word that is stored in the code register 14. Additionally, the code word may be delivered to the control unit 2. The code circuit 13 or the evaluating circuit 22 uses one code table for transferring the signal of different types of temperature sensors. The code table comprises code words that represent with a first part a temperature range that is limited by a reference temperature and with a second part a temperature difference to the reference temperature.

Figure 3:
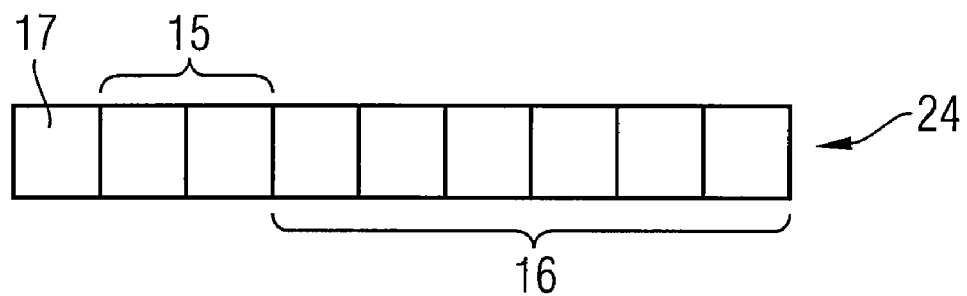
FIG. 3 is a schematic view of a code word.

FIG. 3 depicts a schematic view of a code word 24 that comprises eight data bits, whereby a first part 15 has two bits and indicates a temperature range that is e.g. lower than the first reference temperature, between the first and a second reference temperature or higher than a second reference temperature. Further six data bits are disposed to store a temperature difference value that depends on the used type of temperature sensor and on the measured temperature and the temperature range indicated by the bits of the first part of the code word. The further six data bits refer to a second part 16 of the code word 24.

In a further embodiment, the code word 24 may additionally comprise a sensor bit 17 that indicates which type of temperature sensor is arranged.

The evaluating circuit 22 delivers a code word 24 referring to the sensed temperature and the delivered analog signal of the temperature sensor to the control unit 2. The evaluating circuit transfers the digital signal of the A/D converter according to the code table. The control unit 2 checks the temperature according the code table and decides depending on a predetermined rule whether a refresh frequency for refreshing the charge of the memory cells may be changed according the temperature of the memory 1. In a further embodiment, the evaluating circuit 22 provides the code word 24 to other circuits of the memory 1 or to an output of the memory 1.

In another embodiment, the control unit 2 checks whether the sensed temperature (determined by indexing into the code table 25 using the code word 24) requires that any clock signal of a clock circuit 19 should be changed.

In another embodiment, the control unit 2 may change the frequency of accessing the memory cells to prevent an overheating.

In a further embodiment, the control unit or an external memory controller may only check the first two data bits of the eight data bits of the code word 24 as depicted in FIG. 3 to detect whether the temperature is lower or at or higher than the reference temperature. A bit combination of high and low (10) indicates a temperature below the first reference temperature and a bit combination of low and high (01) indicates a temperature at or above the first reference temperature. Thus it is not necessary to check more than the first two bits of the code word.

FIG. 4 depicts a code table 25 that depicts in a first column 41 the code words, in a second column 42 the two first bits (MSB) of the code words, in a third column 43 the six last bits (LSB) of the code word, in a fourth column 44 the temperature that is sensed by a trip point temperature sensor, in a fifth column 45 the temperature that is sensed by a continuous temperature sensor and in a sixth column 46 the temperature range that corresponds to the sensed temperature. Tj defines the sensed temperature, Tjx the lowest first reference temperature, Tj7.8 the second reference temperature at which the refresh cycle time is changed from 7.8 μsec to 3.9 μsec. Tjom is the third reference temperature and indicates a maximum operation temperature of the memory 1. In the fifth column 45 the sensed temperature Tj is calculated with the first, second or third reference temperature Tjx, Tj7.8, Tjom minus a value in degree Celsius. The second reference temperature Tj7.8 is the reference temperature at which the refresh period is changed from 7.8 µsec to 3.9 µsec. In a sixth column 46 the temperature range is indicated by a refresh time TR7.8 or TR 3.9 or TR OH that means that the refresh time is 7.8 µsec or 3.9 µsec or the memory is overheated. The abbreviation IC means that there is an incomplete conversion. The canceled code words (struck out) of the first column 41 are not allowed.

One advantage of the invention is that the code table 25 uses one code word for different types of temperature sensors. The first column 41 depicts the code words that are used for the code table. In the second column 42 only the first two most significant bits of the code words are depicted. In the code table, the first significant bits indicate a temperature range. The bit combination 00 indicates a first temperature range that is lower than a first reference temperature Tjx. The bit combination 01 of the two most significant bits indicate a second temperature range that is lower than a second reference temperature Tj7.8 and higher than the first reference temperature. The bit combination 10 of the first two most significant bits indicate a third temperature range that is higher than the second reference temperature and lower than a third reference temperature Tjom. The bit combination 11 of the two most significant bits indicate a fourth temperature range that is higher than the third reference temperature Tjom. The word code with the bit combination 00 00 00 00 and 01 00 00 00 and 100 00 00 0 are not allowed.

In the third column 43 the sixth least significant bits of the code word are depicted. If a single trip point temperature sensor is disposed, then the code circuit 13 or the A/D converter 21 and the evaluating circuit 22 transfer the signal of the single trip temperature sensor and the first two most significant bits of the code word as depicted in the second column 42. Depending on the used single trip temperature sensor a signal is generated that indicates that the temperature is lower or higher than a reference temperature. If the single trip point temperature sensor has the first reference temperature Tjx as a reference temperature, then the signal of the single trip point temperature sensor is transferred in a first bit combination 00 or in a second bit combination 01. The first bit combination 00 is used if a sensed temperature is lower than the first reference temperature. The second bit combination 01 is used if the sensed temperature is higher than the first reference temperature.

If the used single trip point temperature sensor has as a reference temperature the second reference temperature Tj7.8, then the code circuit 13 or the evaluating circuit 22 generate depending on the signal of the single trip point temperature sensor the second bit combination 01 or the third bit combination 10. The first bit combination 01 indicates that the sensed temperature is lower than the second reference temperature. The third bit combination 10 of the two most significant bits of the code word indicate that the sensed temperature is higher than the second reference temperature. If there is a single trip point temperature used with the third reference temperature Tjom, than the code circuit 13 of the evaluating circuit 22 generate the third bit combination 10 or the fourth bit combination 11 for the first two most significant bits of the code words. The third bit combination 10 of the first two most significant bits of the code word indicate a temperature that is lower than the third reference temperature Tjom. The fourth bit combination 11 of the first two most significant bits of the code word indicate a temperature that is higher than the third reference temperature Tjom. Depending on the embodiment, there might also be several single trip point sensors with different reference temperatures. The signals of the single trip point temperature sensors with different reference temperatures are transferred in the first two most significant bits of the code word according the code table 25 as explained above.

If there is a continuous temperature sensor used, then the code circuit 13 or the evaluating circuit 22 transfer the signal of the continuous temperature sensor in a code word according the first column 41 of the code table 25 of FIG. 4, whereby the first two most significant bits of the code word indicate a first, a second, a third or a fourth temperature range. The temperature ranges that are indicated by the first two most significant bits are the same as for the single trip point sensors as explained above. The first two most significant bits with the bit combination 01 indicate a temperature range that is lower than the second reference temperature Tj7.8. Additionally, the code circuit 13 or the evaluating circuit 22 generate also for a continuous temperature sensor the six least significant bits of the code word as depicted in the third column 43. The six least significant bits of a code word indicate a difference between the reference temperature of the range that is determined by the first two most significant bits of the code word and the sensed temperature. For example, the code word with the bit combination 00 11 11 11 indicates a first temperature range with the first two most significant bits with the value 00 that is lower than a first reference temperature Tjx. Additionally, the six least significant bits with a bit combination 11 11 11 indicate that the continuous temperature sensor sense the temperature that is 63° C. lower than the first reference temperature as it is indicated in the fifth column 45 of the code table 25. The six least significant bits of the code word with the bit combination 11 11 10 indicate that the sensed temperature is 62° C. lower than the reference temperature that is indicated by the first two most significant bits of the code word. Using this code it is possible to indicate a temperature in 63 steps of 1° C. of difference to a reference temperature that is determined by the first two most significant bits of the code word.

For example the code word with the eighth combination 11 11 11 11 indicates with the first two most significant bits with a bit combination 11 that the sensed temperature is in a temperature range that is higher than the third reference temperature Tjom. The combination of the six least significant bits 11 11 11 indicate that the sensed temperature is 63° C. higher than the third reference temperature Tjom as indicated in the fifth column 45 of the code table 25.

The second reference temperature Tj7.8 indicates the temperature value below which a refresh of the memory cells is proceeded every 7.8 µsec. In one embodiment the third reference temperature Tjom corresponds to a temperature at which the refresh of the dynamic memory cells is processed every 3.9 µsec.

The code circuit 13 or the evaluating circuit 22 comprise a table that determines the correlation between the signal of the used temperature sensor and the corresponding code words. The table may be stored in a storage that is connected with the code circuit 13 or the evaluating circuit 22 and in one embodiment arranged on the memory. The control unit 2 comprises a storage in which the code table 25 is stored. Therefore in a further embodiment, if different types of temperature sensors are used, then different tables are disposed for the evaluating circuit 22 or the code circuit 13 to provide the correlation between the signal of the used temperature sensor and the corresponding code word.

In a further embodiment a conversion from the signal of the temperature sensor to the code word may be done by a circuit doing arithmetic and/or logical operations, where only the reference temperatures are stored on the memory. The circuit determines depending on the signal of the temperature sensor, the type of the temperature sensor and the reference temperatures the code words as explained for the code table.

Figure 5:
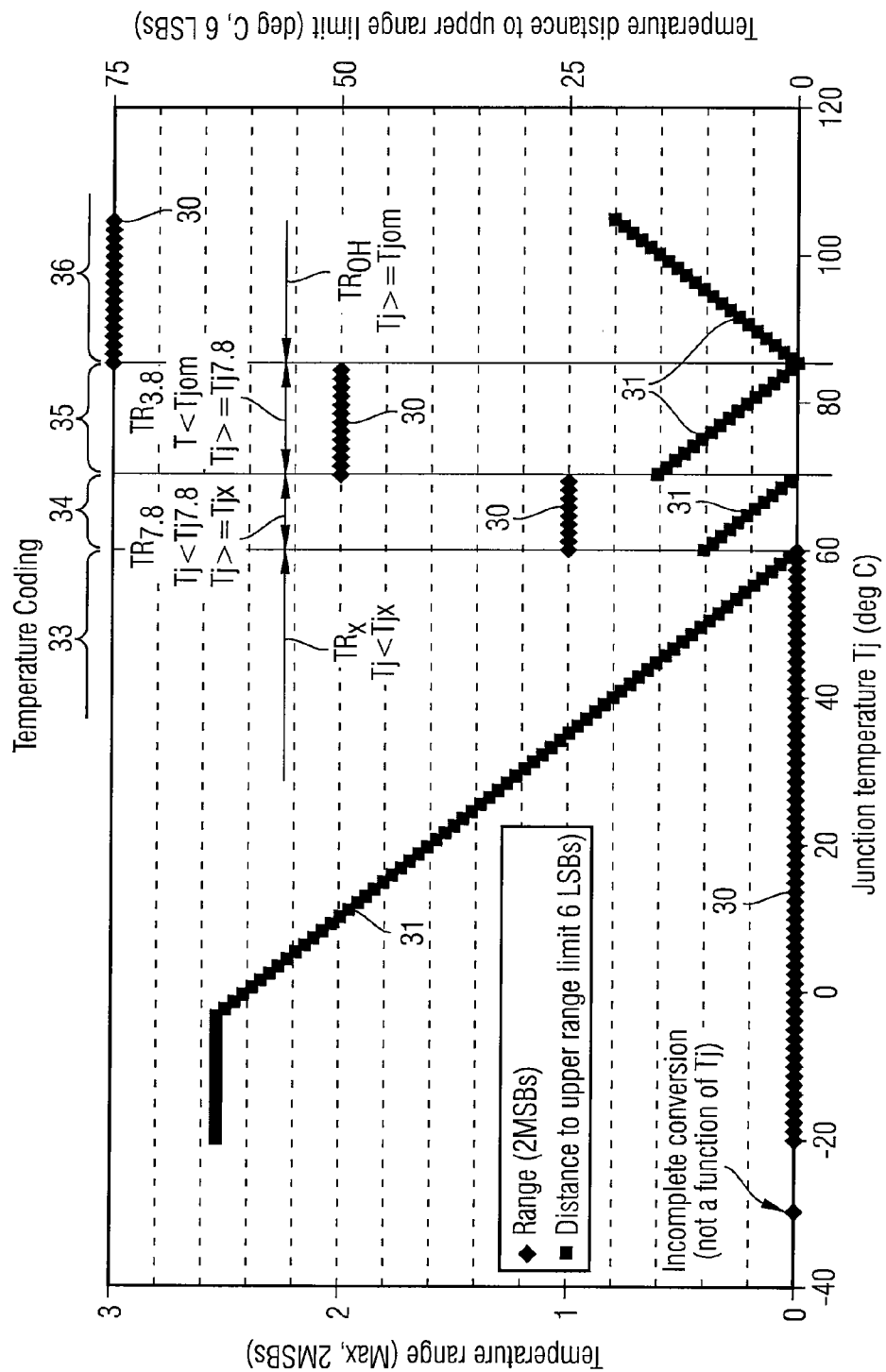
FIG. 5 is a diagram depicting temperature values of different types of temperature sensors.

FIG. 5 depicts a diagram with a first line 30 for the sensed temperature of the single point sensor and a second line 31 for the continuous temperature sensor depicting the junction temperature of the selecting transistor in degree Celsius. In this example the first reference temperature Tjx corresponds to 60 degree Celsius junction temperature of the selecting transistor. A first temperature range 33 is below the first reference temperature Tjx, a second temperature range 34 is between the first reference temperature Tjx and the second reference temperature Tj7.8, a third temperature range 35 is between the second reference temperature Tj7.8 and the third reference temperature Tjom and a fourth temperature range 36 is higher than the third reference temperature Tjom.

Depending on the used embodiment, the values for the reference temperatures may be programmed on the memory 1, e.g. by using a storage with programmable fuses.

As it may be seen in FIG. 5, the two most significant bits indicate in a rough but simple manner temperature regions and the six least significant bits of the code word in combination with the two most significant bits indicate a more precise temperature information in ° C. referred to a reference temperature.

The code circuit 13 or the evaluating circuit 22 write only the first two most significant bits in the code word if a single trip point temperature sensor is used. Additionally, if a continuous temperature sensor is used, then the code circuit 13 or the evaluating circuit 22 writes the two most significant bits and the six least significant bits of the code word in the code register 14. The control circuit 2 or the external memory controller may check only the first two significant bits of the code word for receiving a rough temperature information or check also the six least significant bits of the code word if the a control unit 2 needs a more precise information about the temperature of the memory 1.

The code circuit 13 or the evaluating circuit 22 writes the first two bits of the first part of the code word according to the signal of the single trip point sensor. The six bits of the second part of the code word are filled with the bit combination 111111. It is advantageous to use a fixed bit combination 111111 for the second part corresponding to the maximum temperature difference, so that the control unit 2 or the external memory controller does not trigger a temperature dependent action, which could be the case for other codes signifying a smaller temperature difference and a control that reacts also on the second part of the code word.

The code circuit 13 or the evaluating circuit transfers the signal of the continuous temperature sensor in a code word, whereby at least one bit of the first part of the code word indicates a temperature range limited by a reference temperature. The bits of the second part of the code word indicate a difference temperature to the reference temperature. The control unit 2 or further units that use the code word have an information with the temperature ranges and the reference temperatures that correspond to the first part of the code word. Furthermore, the control unit or the further units that use the code words have an information with the temperatures that correspond to the second part of the code word. The temperature range decides whether the difference temperature has to be added or subtracted from the reference temperature. This information may be stored or an evaluating unit may be disposed that calculates the temperature using the code word.

Another advantage of the code is that the controlling unit 2 or the external controlling unit or other circuits need not know the reference temperatures, as they are implicitly coded in the first part of the code word. The first part indicates the temperature ranges that correspond to reference temperatures which signify a predetermined functional requirement, e.g. the temperature for doubling the refresh frequency. Thus, different memories could use different reference temperatures that are not known to the memory controller 2 or the external controller and need to be known, as the memory controller 2 or the external controller can simply react on the indication alone or below a reference temperature that is indicated by the first part of the code word. In addition, if a continuous temperature sensor is used, the controller unit 2 or the external controller do not need to know the different possible reference temperatures, but can react on the difference to an unknown reference temperature. The difference is indicated by the second part of the code word. There might be several reference temperatures per memory.

In a further embodiment the first part indicates a temperature range and the second part indicates a temperature difference to a reference temperature, the code circuit writes depending on the signal of the temperature sensor a predetermined code in the first part and a further predetermined code in the second part depending on the signal and/or the type of temperature sensor.

In another embodiment the first part indicates a temperature range limited by a reference temperature and the second part indicates a temperature difference to the reference temperature, the code circuit writes depending on the signal of the temperature sensor a predetermined code in the first part and a further predetermined code in the second part depending on the signal and/or the type of temperature sensor.

While the foregoing is directed to embodiments of the present invention, other and further embodiments of the invention may be devised without departing from the basic scope thereof, and the scope thereof is determined by the claims that follow.

What is claimed is:

1. A memory device, comprising:
   a memory array;
   a temperature sensor that measures a temperature of a part of the memory device; and
   a code circuit communicably coupled to the temperature sensor in order to receive an input representative of the measured temperature and wherein the code circuit is configured to output a code word reflective of the temperature measured by the temperature sensor and the type of the temperature sensor; the code word having a first part defined by at least one bit for a first type of temperature sensor and the second part defined by at least one bit for a second type of temperature sensor; and wherein the code circuit is configured to output the first and second parts of the code word depending on the signal of the temperature sensor.

2. The memory device of claim 1, wherein the first part indicates a temperature range and the second part indicates a temperature difference with respect to a reference temperature.

3. The memory device of claim 1, wherein the first part indicates a temperature range with respect to a reference temperature and the second part indicates a temperature difference with respect to the reference temperature.

4. The memory device of claim 1, further comprising a table containing a plurality of values for the first part and the second part of the code word; wherein the code circuit is configured to access the table in order to convert the signal of the temperature sensor into the code word.

5. The memory device of claim 1, further comprising a refresh control circuit configured to control a refresh operation of the memory array depending on the code word.

6. A memory device, comprising:
a memory array;
a temperature sensor that measures a temperature of a part of the memory device; and
a code circuit communicably coupled to the temperature sensor in order to receive an input representative of the measured temperature and wherein the code circuit is configured to output a code word reflective of the temperature measured by the temperature sensor and the type of the temperature sensor; the code word having a first part defined by at least one bit for a first type of temperature sensor and the second part defined by at least one bit for a second type of temperature sensor; wherein the first part represents a temperature range limited by a reference temperature and the second part represents a temperature difference with respect to the reference temperature.

7. The memory device of claim 6, wherein the code circuit comprises an evaluating circuit to perform the converting of the signal from the temperature sensor, and further comprises an A/D converter connected between the temperature sensor and the evaluating circuit.

8. The memory device of claim 6, wherein the temperature sensor is one of a first type of temperature sensor configured to detect whether the temperature of the memory is higher or lower than a reference temperature, and a first type of temperature sensor configured to detect a specific temperature value calculated as a difference between the reference temperature and one of a plurality of predefined temperature values.

9. The memory device of claim 8, further comprising a register for storing the reference temperature.

10. The memory device of claim 6, further comprising an external interface for communicating with an external control circuit to which the code word is provided, the external control circuit being configured to issue control signals responsive to the code word according to predefined rules.

11. The memory device of claim 6, further comprising a control circuit configured to control at least one of a writing or reading operation of the memory array depending on the code word.

12. The memory device of claim 6, further comprising a table containing a plurality of values for the first part and the second part of the code word; wherein the code circuit is configured to access the table in order to convert the signal of the temperature sensor into the code word.

13. A dynamic memory, comprising: A memory device, comprising:
a memory array comprising a plurality of memory cells;
a temperature sensor that measures the temperature of a part of the memory device;
a code circuit communicably coupled to the temperature sensor in order to receive an input representative of the measured temperature and wherein the code circuit is configured to output a code word reflective of the temperature measured by the temperature sensor and the type of the temperature sensor; the code word having a first part defined by at least one bit for a first type of temperature sensor and the second part defined by at least one bit for a second type of temperature sensor; wherein the first part represents a temperature range limited by a reference temperature and the second part represents a temperature difference with respect to the reference temperature; and
a refresh control circuit configured to control a refresh operation of the memory cells depending on the code word.

14. The dynamic memory of claim 13, wherein the refresh control circuit is an external memory controller.

15. A method for determining a temperature of a memory device with memory cells, comprising:
outputting, by the evaluating circuit, a code word reflective of a measured temperature of the memory device and the type of temperature sensor used to measure the temperature; the code word having a first part defined by at least one bit for a first type of temperature sensor and the second part defined by at least one bit for a second type of temperature sensor; and wherein the code circuit is configured to output the first and second parts of the code word depending on the signal of the temperature sensor; and
changing an operating characteristic of the memory device dependent on the code word.

16. A method for determining a temperature of a memory device with memory cells, comprising:
sensing, by a temperature sensor of the memory device, a temperature;
receiving, by an evaluating circuit, an input representative of the measured temperature;
outputting, by the evaluating circuit, a code word reflective of the temperature measured by the temperature sensor and the type of the temperature sensor; the code word having a first part defined by at least one bit for a first type of temperature sensor and the second part defined by at least one bit for a second type of temperature sensor; and wherein the code circuit is configured to output the first and second parts of the code word depending on the signal of the temperature sensor.

17. The method of claim 15, refreshing the memory cells in a manner dependent on the code word.

18. The method of claim 15, accessing the memory cells in a manner dependent on the code word.

19. A memory device, comprising:
a memory array;
a temperature sensor proximate the memory array and configured to measure a temperature; and
an evaluating circuit configured to receive a signal representative of the temperature measured by the temperature sensor and configured to generate a code word indicative of the measured temperature and a type of the temperature sensor, the temperature sensor being selected from one of at least two different temperature sensor types.

20. The memory device of claim 19, wherein the code word generated by the evaluating circuit includes a first portion comprising one or more bits, the first portion being capable of representing at least two temperature ranges according to a value of the one or more bits.

21. The memory device of claim 19, wherein the code word generated by the evaluating circuit further includes a second portion comprising one or more bits, the second portion being capable of representing a plurality of specific temperature values according to a value of the one or more bits, the specific temperature values being calculated by the evaluating circuit with respect to one or more reference temperatures.

22. The memory device of claim 19, wherein the at least two different temperature sensor types include a trip point sensor and a continuous sensor.

* * * * *